(12) United States Patent
Kim et al.

(10) Patent No.: US 8,891,050 B2
(45) Date of Patent: Nov. 18, 2014

(54) LIQUID CRYSTAL DISPLAY DEVICE AND METHOD FOR FABRICATING THE SAME

(75) Inventors: Kang Il Kim, Seoul (KR); Jung Il Lee, Goyang-si (KR); Jung Ho Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 262 days.

(21) Appl. No.: 13/461,593

(22) Filed: May 1, 2012

(65) Prior Publication Data

US 2013/0155358 A1    Jun. 20, 2013

(30) Foreign Application Priority Data

Dec. 15, 2011    (KR) .................. 10-2011-0135654
Apr. 10, 2012    (KR) .................. 10-2012-0037395

(51) Int. Cl.
     *G02F 1/1343*      (2006.01)

(52) U.S. Cl.
     USPC .............. 349/141; 349/147; 349/192; 438/30

(58) Field of Classification Search
     CPC ................ G02F 1/134363; G02F 2001/13629; H01L 27/1214

USPC .............................. 349/141, 147, 192; 438/30
See application file for complete search history.

(56) References Cited

U.S. PATENT DOCUMENTS

| | | | |
|---|---|---|---|
| 2004/0017533 A1* | 1/2004 | Sumino .................... | 349/141 |
| 2006/0139552 A1* | 6/2006 | Ahn ......................... | 349/149 |
| 2006/0220018 A1* | 10/2006 | Ahn et al. ................. | 257/59 |
| 2007/0001979 A1* | 1/2007 | Yoo et al. ................. | 345/98 |
| 2007/0013853 A1* | 1/2007 | Saigo et al. ............... | 349/141 |

\* cited by examiner

*Primary Examiner* — Michael Caley
(74) *Attorney, Agent, or Firm* — Fenwick & West LLP

(57) ABSTRACT

A liquid crystal display device is disclosed. The liquid crystal display device includes: a substrate; gate and data lines arranged to cross each other on the substrate and to define a pixel region; a switching element disposed at an intersection of the gate and data lines; and pixel electrodes and common electrodes arranged alternately with each other and parallel to the data line, within the pixel region. The pixel electrode and the common electrode are formed to have a stacked layer structure of a transparent conductive material layer and an opaque metal layer, each having a line-width of 3.5 μm or less. Such a liquid crystal display device can enhance the transmittance of a pixel region with preventing the chuck stain by forming electrodes in a double layer structure with a transparent conductive material layer and an opaque metal layer.

14 Claims, 4 Drawing Sheets

PRIOR ART

LIQUID CRYSTAL DISPLAY DEVICE AND METHOD FOR FABRICATING THE SAME

CROSS-REFERENCE TO RELATED APPLICATION

This application claims priority under 35 U.S.C. 119(a) to Korean Patent Application No. 10-2011-0135654, filed on Dec. 15, 2011 and No. 10-2012-0037395, filed on Apr. 10, 2012, which are hereby incorporated by references in their entirety.

BACKGROUND

1. Field of the Disclosure

This disclosure relates to a liquid crystal display (LCD) device, and more particularly to an LCD device and a fabricating method thereof which are adapted to prevent a chuck stain and enhance the transmittance of a pixel by forming a semitransparent multi-layered electrode including a transparent conductive material layer and an opaque metal layer.

2. Description of the Related Art

In general, LCD devices control the light transmittance of a liquid crystal with a dielectric anisotropy using an electric field to display an image. The LCD devices are usually fabricated by combining a color filter array substrate with a thin film transistor array substrate with a liquid crystal layer sandwiched between the two substrates.

Recently, LCD devices of several new operating principles have been developed to resolve a narrow viewing angle of an LCD device. LCD devices with a wide viewing angle may operate in, among other modes, an in-plane switching (IPS) mode, an optically compensated birefringence (OCB) mode or a fringe field switching (FFS) mode.

Among the LCD devices with the wide viewing angle, the IPS mode LCD device allows a pixel electrode and a common electrode to be arranged on the same substrate so that a horizontal electric field is induced between the electrodes. In such LCD devices, major axes of liquid crystal molecules are aligned in a horizontal direction with respect to the substrate. Accordingly, the IPS mode LCD device has a wider viewing angle than that of a TN (Twisted Nematic) mode LCD device of the related art.

BRIEF SUMMARY

Embodiments relate to a liquid crystal display (LCD) device that includes pixel electrodes and common electrodes formed in a stacked layer structure of a transparent conductive material layer and an opaque metal layer. The LDE device may also include a substrate, gate and data lines arranged to cross each other on the substrate and to define a pixel region, and a switching element disposed at an intersection of the gate and data lines. The pixel electrodes and common electrodes are arranged within the pixel region to alternate with each other and are parallel to the data line. The stacked layer structure has a light transmittance set to a value that prevents formation of a defect during a photolithography process for fabricating the LCD device.

Embodiments also relate to a method of fabricating a liquid crystal display device. The method includes: forming a metal film on a substrate; forming a gate electrode, a gate line and a first common line using a first masking procedure; forming a gate insulation film on the substrate provided with the gate electrode; forming a channel layer, a source electrode, a drain electrode and a data line using a second masking procedure; forming a protective film on the substrate provided with the source and drain electrodes; forming a contact hole, which exposes a part of the drain electrode, in the protective film using to a third masking procedure; forming a transparent conductive material layer and an opaque metal layer on the substrate provided with the protective film; and performing for the opaque metal layer and the transparent conductive material layer an etch process according to a fourth masking procedure to form a second common line, and pixel and common electrodes which are formed in a structure of plural slit bars. The pixel electrode and the common electrode are formed in a stacked layer structure of the transparent conductive material layer and the opaque metal layer. Each of the transparent conductive material layer and the opaque metal layer has a line-width of 3.5 µm or less.

Advantages of the disclosed embodiments include, for example, preventing chuck stain by forming electrodes in a double layered structure with a transparent conductive material layer and an opaque metal layer.

Advantages of the disclosed embodiments also include implementing pixel electrodes with a fine line-width by forming the electrodes in a double layer structure with a transparent conductive material layer and an opaque metal layer.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION

Figure 1:
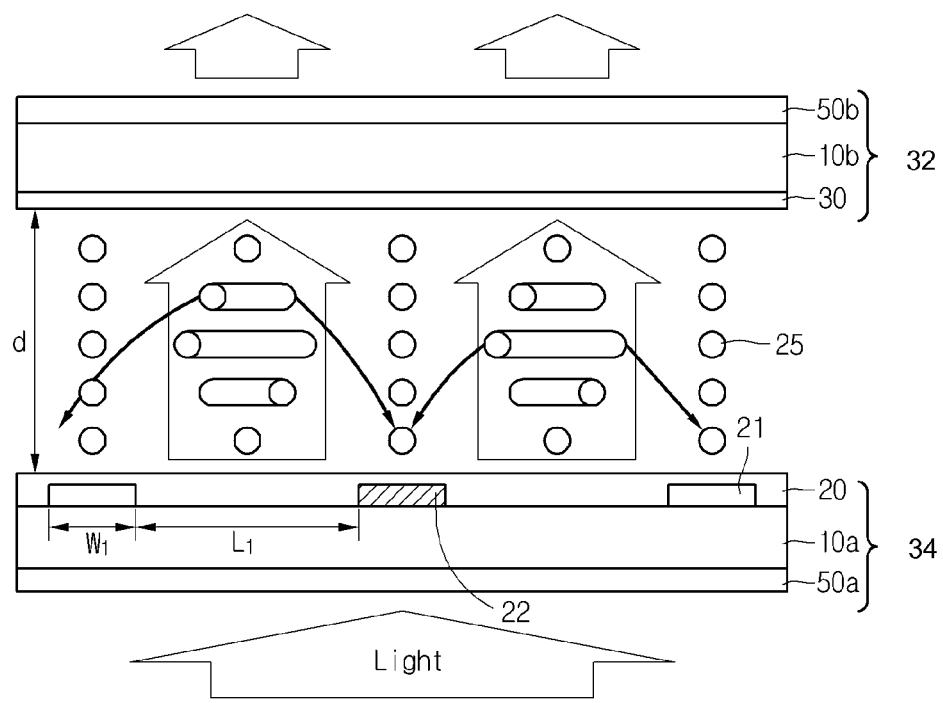
FIG. 1 is a cross-sectional view showing a typical structure of an IPS mode LCD device.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing a typical structure of an in-plane switching (IPS) mode LCD device. The IPS mode LCD device includes an array substrate 34 and a color filter substrate 32. The array substrate 34 is obtained by forming thin film transistors (not shown), pixel electrodes 21 and a common electrode 22 on a first substrate 10a, and then coating a first alignment 20 film on the entire surface of the first substrate 10a. The color filter substrate 32 facing the array substrate 34 includes a color filter layer (not shown) formed on a second substrate 10b, and a second alignment film 30 formed on the color filter layer.

The array substrate 34 and the color filter substrate 32 facing each other with a liquid crystal layer 25 sandwiched between the substrates 32, 34. In such an LCD device, a horizontal electric field is generated between the pixel electrode 21 and the common electrode 22 when a voltage difference is applied between the pixel electrode 21 and the common electrode 22. The horizontal electric field causes axes of liquid crystal molecules within the liquid crystal layer 25 to be aligned parallel to the first and second substrates 10a and 10b. In this way, the IPS mode LCD device can realize a wider viewing angle compared to conventional twisted nematic (TN) mode LCD devices.

The array substrate 34 further includes a first polarizer layer 50a for polarizing light that enters the liquid crystal layer 25. The color filter substrate 32 also includes a second polarizer layer 50b for polarizing light that passes through the liquid crystal layer 25. The first polarizer layer 50a in conjunction with the second polarizer layer 50b controls the light that is emitted through the color filter substrate 32.

Generally, the pixel electrode 21 is formed of a transparent conductive material, and the common electrode 22 is formed of an opaque metal. As such, the light transmittance of a pixel region depends on widths W1 of the pixel and common electrodes 21 and 22 and the distance L1 between the pixel electrode 21 and the common electrode 22. The transmittance herein refers to the average transmittance of light across the light wavelengths from 380 to 530 nm.

To meet customer demand for higher definition, the size of each pixel is being reduced and the non-transmission region occupied by the thin film transistor is being increased relatively to the size of the pixel in newly developed LCD devices. The reduction in the size of the pixel has come to require a higher light transmittance. However, it is difficult to form the pixel electrode 21 and the common electrode 22 below a critical width due to characteristics of exposure tools in a photolithography process.

Figure 2:
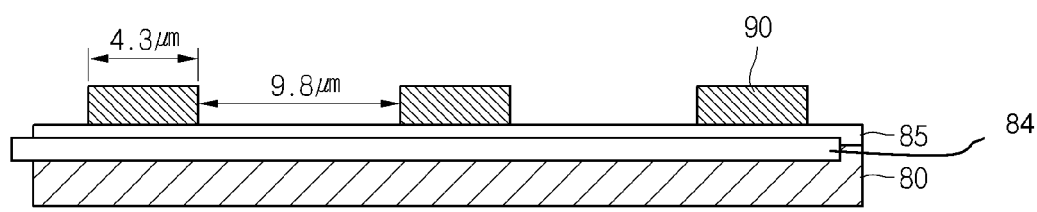
FIG. 2 is a cross-sectional view illustrating the cause of a chuck stain when an electrode of the LCD device is formed through a conventional fabricating process.

FIG. 2 is a cross-sectional view illustrating the cause of a chuck stain when an electrode of the LCD device is formed through a conventional fabricating process. During the fabricating process of the LCD device, a substrate 84 is placed on a chuck 80 to perform a photolithography process. A transparent conductive material layer 85 is formed on the substrate. After placing the substrate 84 on the chuck 80, a photo resist is coated on the transparent conductive material layer 85. Then, an exposing process and a developing process are sequentially performed for the photo resist film to form photo resist patterns 90 on the transparent conductive material layer 85 for a photolithography process, and pattern the transparent conductive material layer 85 on substrate 84.

In order to enhance the light transmittance of a pixel region, the pixel electrode 21 and the common electrode 22 can be formed from a transparent conductive material. In this case, it is difficult to form the photo resist pattern 90 with a width of less than 4.3 μm due to a defect known as a "chuck stain." During the photolithography process, part of light irradiated on the photo resist film can penetrate through the transparent conductive material and the substrate 84 in an exposing region. The part of the penetrating light is reflected by the chuck 80, causing a lower portion of the photo resist film in the exposing region to be re-exposed to the reflected light. Such re-exposure of the lower portion of the photo resist film form undesirable exposure of light on the photo resist film, eventually resulting in irregular shapes in the electrodes formed on the substrate. Such chuck stain becomes more prominent as the width of the photo resist pattern 90 decreases. Generally, it is difficult to form the photo resist pattern 90 having a width of less than 4.3 μm due to the chuck stain. Meanwhile, the distance between the photo resist patterns 90 is typically less than 9.8 μm.

Figure 3:
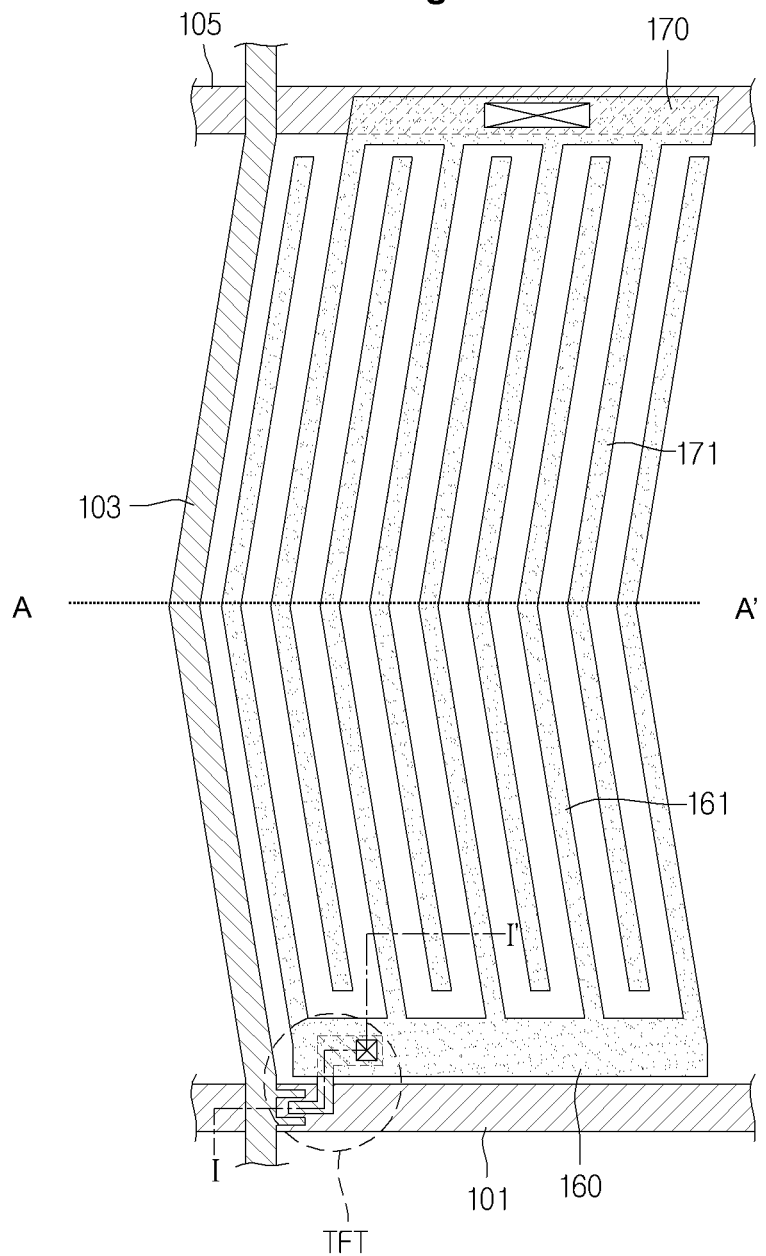
FIG. 3 is a plan view showing the structure of a pixel within an LCD device according to one embodiment.

FIG. 3 is a plan view showing the structure of a pixel within an LCD device according to one embodiment. A pixel region (or a sub-pixel region) of the IPS mode LCD device according to FIG. 3 can include a gate line 101 and a data line 103 that intersect with the gate line 101. The IPS mode LCD device can further include a thin film transistor TFT which is disposed at the intersection of the gate and data lines 101 and 103 and used as a switching element.

Also, a first common line 105 is disposed parallel and at an opposite side of the pixel region relative to the gate line 101. Second pixel electrodes 161 and common electrodes 171 are arranged in an alternating manner with a fixed interval within the pixel region. The second pixel electrodes 161 and the common electrodes 171 have a fine line-width of no more than 3.5 μm, as described below with reference to FIG. 5.

In one embodiment, each of the second pixel electrodes 161 is formed in a slit bar shape. The second pixel electrodes 161 branches off from a first pixel electrode 160 that is electrically connected to a drain electrode of the thin film transistor TFT into the pixel region. Similarly, each of the common electrodes 171 is formed in the slit bar shape. The common electrodes 171 branches off from a second common line 170 that is electrically connected to the first common line 105 into the pixel region.

The second pixel electrodes 161 and the common electrodes 171 are bent in such a manner that their top and bottom portions are symmetrical with respect to a center line A-A' of the pixel region parallel to the gate line 101.

The first pixel electrode 160, the second pixel electrodes 161, the second common line 170 and the common electrodes 171 can be formed by stacking a transparent conductive material layer and a metal layer. The metal layer is reduced herein to decrease the overall transmittance of the electrodes, as described below in detail.

The transparent conductive material layer can be formed from materials such as indium-tin-oxide (ITO), indium-zinc-oxide (IZO), and indium-tin-zinc-oxide (ITZO), The metal layer can be formed from molybdenum Mo, titanium Ti, tantalum Ta, tungsten W, copper Cu, chrome Cr, aluminum As and an alloy thereof (e.g., an alloy including molybdenum Mo and titanium Ti).

The thin film transistor TFT uses the gate line 101 as a gate electrode. Such a thin film transistor TFT includes a channel layer, a source electrode and a drain electrode which are formed on the gate electrode.

Embodiments not only allow photo resist patterns (formed within the pixel region and used for the formation of the second pixel electrodes 161 and the common electrodes 171) to each have a width of 3.5 μm (compared to 4.3 μm of FIG. 2), but also allow the distance between the photo resist patterns to become 14.3 m or more (compared to 9.8 μm of FIG. 2). If the second pixel electrodes 161 and the common electrodes 171 are formed using the photo resist patterns with the above-mentioned width as masks, the etched critical dimension of the electrodes becomes about 1.5 μm, resulting in electrodes with a width of 3.5 μm or less.

Also, the second pixel electrodes 161 and the common electrodes 171 are formed by stacking the transparent conductive material layer and the opaque metal layer. The opaque metal layer can be made thin to obtain a sufficient transmittance. For example, the second pixel electrodes 161 and the common electrodes 171 can be formed in a stacked-layer structure with an ITO layer and a molybdenum-titanium alloy layer. In this case, when the molybdenum-titanium alloy layer is deposited with a thickness of about 50 Å, the transmittance of an electrode zone can become 70%, which is sufficiently low to prevent the formation of a chuck stain. The electrode zone refers to an area of the LCD device where the electrode is formed. The transmittance of the electrode zone more than 70% tends to form the chuck stain. Although it is generally preferable to increase the transmittance of the electrode zone for a wider viewing angle, the chuck stain poses an obstacle to increasing the transmittance of the electrode zone.

Embodiments relate to forming a semi-transparent electrode with a fixed transmittance by stacking a transparent conductive material layer and an opaque metal layer. The stacking order of the transparent conductive material layer and the opaque metal layer is not limited, and hence, the stacking order of the transparent conductive material layer and the opaque metal layer can be reversed. The LCD device and the fabricating method thereof according to embodiments allow the electrodes to be formed to have a double layered structure with the transparent conductive material layer and the opaque metal layer. Therefore, the transmittance of the pixel region can be increased while preventing the chuck stain. Moreover, the LCD device and the fabricating method thereof according to embodiments can provide pixel electrodes with a thin line-width.

The LCD device and the fabricating method thereof according to embodiments allow the electrodes to be formed to have a double layered structure with the transparent conductive material layer and the opaque metal layer. Therefore, the overall transmittance of the pixel region can be increased without causing the chuck stain in the exposure process. Moreover, the LCD device and the fabricating method according to embodiments can allow the pixel electrodes to have a thin line-width.

Figure 4:
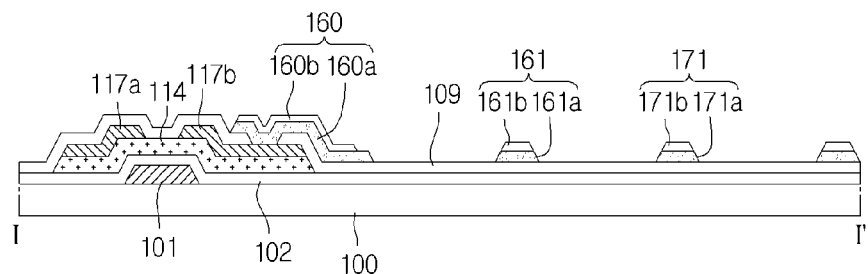
FIG. 4 is a cross-sectional view showing the LCD device taken along a line I-I' in FIG. 3, according to one embodiment.

FIG. 4 is a cross-sectional view showing the LCD device taken along a line I-I' in FIG. 3, according to one embodiment. A metal film is deposited on a lower substrate 100 formed of a transparent insulation material, for example, using a sputtering process. Then, an etch process is performed on the metal film according to a first masking procedure. In the first masking procedure, a photo resist corresponding to a photosensitive material is formed on the deposited metal film. The photo resist is exposed and developed using a mask which is defined into a transmission region and a non-transmission region, thereby forming photo resist patterns.

Subsequently, the metal film is etched using the photo resist patterns as an etch mask, thereby forming a gate line, a gate electrode 101 and a first common line ("105" in FIG. 3). The gate electrode is implemented by using the gate line as an electrode.

The gate line (shown by reference number 101 in FIG. 3) can be formed by stacking at least one of the following materials: molybdenum Mo, titanium Ti, tantalum Ta, tungsten W, copper Cu, chrome Cr, aluminum Al and alloys thereof.

After layers such as the gate electrode 101 are formed on the lower substrate 100 as described above, a gate insulation film 102, a channel layer 114 including an amorphous silicon film and an impurity-doped amorphous silicon film (n+ or p+), and source/drain electrodes 117a and 117b are formed using a second masking procedure employing either a diffract mask or a half tone mask. At the same time, a data line is also formed.

The source/drain electrodes 117a and 117b can be formed from materials such as molybdenum Mo, titanium Ti, tantalum Ta, tungsten W, copper Cu, chrome Cr, aluminum Al and alloys thereof. Alternatively, the source/drain electrodes 117a and 117b can be formed from a transparent conductive material such as indium-tin-oxide (ITO). Also, the source/drain electrodes 117a and 117b can be formed by stacking at least two metal films depending on the circumstances.

Thereafter, a protective film 109 is formed on the lower substrate 100 provided with the channel layer 114. A contact hole exposing a part of the drain electrode 117b is formed in the protective film 109 using a third masking procedure.

When the formation of the contact hole is completed as described above, a transparent conductive material layer and an opaque metal layer are stacked on the entire surface of the lower substrate 100. Then, a fourth masking procedure is formed for the stacked layers, thereby forming a first pixel electrode 160, second pixel electrodes 161 and common electrodes 171. The first pixel electrode 160 electrically connects with the drain electrode 117b.

The transparent conductive material layer can include one of indium-tin-oxide (ITO) and indium-zinc-oxide (IZO). The opaque metal layer can include material such as molybdenum Mo, titanium Ti, tantalum Ta, tungsten W, copper Cu, chrome Cr, aluminum Al and alloys thereof. Also, the transparent conductive material layer and the opaque metal layer can be stacked in a reverse order.

Figure 5:
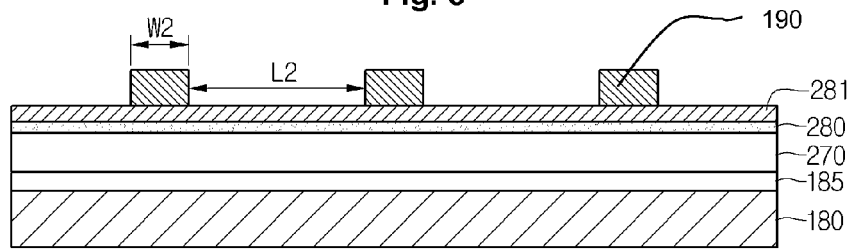
FIG. 5 is a cross-sectional view illustrating a process of forming a fine electrode with a narrow width after a transparent conductive material layer and an opaque metal layer are stacked, according to one embodiment.

After the transparent conductive material layer and the opaque metal layer are stacked, photo resist patterns with a line-width W2 of 3.5 μm or less are formed using an exposure process, as shown in FIG. 5. At this time, the chuck stain is not generated because the opaque metal layer exists within an exposed zone to lower the transmittance. Note that in cases where only the transparent conductive material layer is used to form the electrodes, the chuck stain is generated even through the photo resist pattern has a line-width W1 of 4.3 μm or less due to a higher transmittance.

An etch process is performed for the opaque metal layer and the transparent conductive material layer using the photo resist patterns with a line-width W2 of 3.5 µm or less as an etch mask as shown in FIG. 5 to form the first pixel 160, second pixel electrodes 161 and common electrodes 171 (refer to FIG. 4). The first pixel electrode 160 includes a first pixel pattern portion 160a and a second pixel pattern portion 160b stacked on top of the lower substrate 100. The second pixel electrode 161 includes a first pixel electrode pattern portion 161a and a second pixel electrode pattern portion 161b stacked on top of the lower substrate 100. The common electrode 171 includes a first common electrode pattern 171a and a second common electrode pattern 171b stacked on top of the lower substrate 100.

Figure 7A:
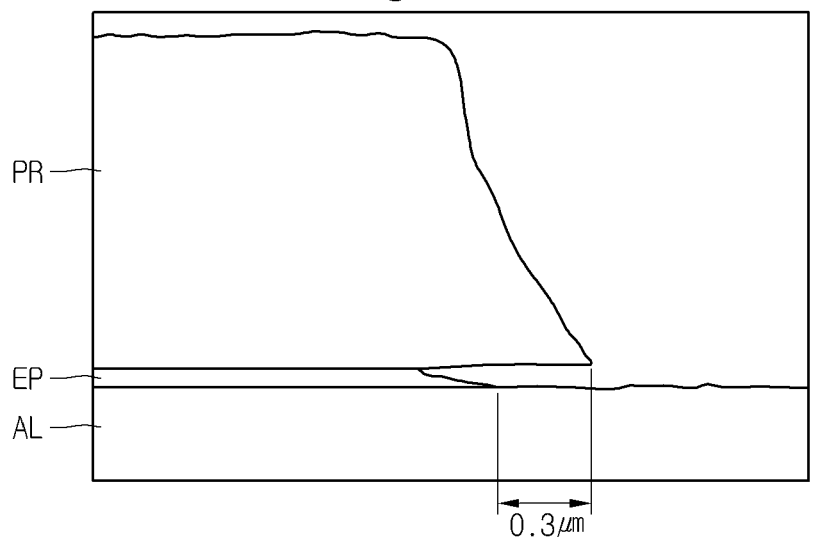
FIGS. 7A and 7B are views showing the results of an etching process for forming a fine electrode with a narrow width according to one embodiment.
Figure 7B:
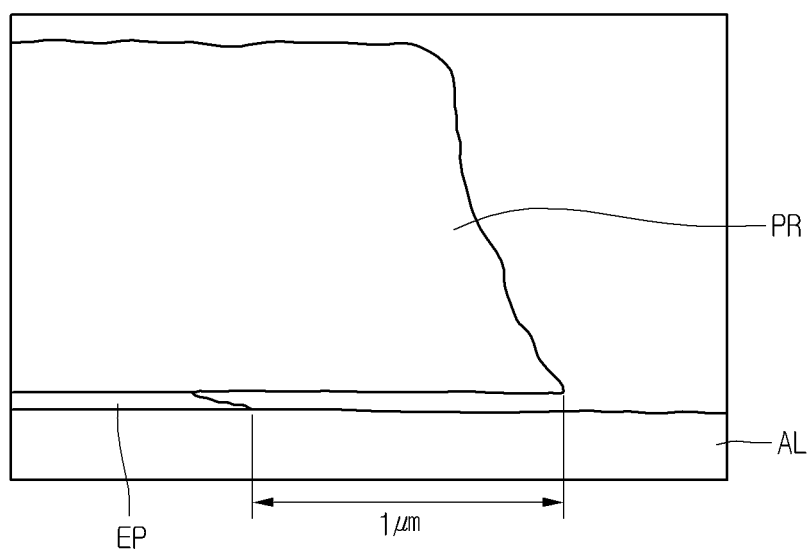

In practice, the second pixel electrode 161 and the common electrode 171 are formed with a line-width thinner than the line width (e.g., 3.5 µm) of the photo resist patterns due to the lateral intrusion of etchant at the etch process. FIGS. 7A and 7B are views showing an etching process which is performed for forming a fine electrode with a narrow width according to one embodiment.

FIG. 5 is a cross-sectional view illustrating a process of forming an electrode with a fine line-width after a transparent conductive material layer and an opaque metal layer are stacked, according to one embodiment. As described above with reference to FIG. 5, a transparent conductive material layer 280 and an opaque metal layer 281 are sequentially formed on a substrate (or a lower substrate) 184 provided with an array layer 270 in which a thin film transistors and insulation layer are stacked and formed after the substrate 184 is placed on a chuck 180. The transparent conductive material layer 280 and the opaque metal layer 281 can be exchanged with each other in the formation sequence.

In one embodiment, the photo resist patterns 190 on the opaque metal layer 281 have a line-width W2 of 3.5 µm. The resist patterns 190 are formed, for example, using an exposure light amount of 24.1 mJ. In this case, the distance between the photo resist patterns 190 becomes 14.3 µm, and a transmittance of 70% is obtained by the opaque metal layer stacked on the transparent conductive material layer. The transmittance of 70% is low enough to avoid the chuck stain. If the opaque metal layer is formed of a molybdenum-titanium (Mo—Ti) alloy, for example, the opaque metal layer has a thickness of 50 Å to 100 Å to achieve such transmittance.

The transparent conductive material layer 280 formed from one of ITO, IZO and ITZO may have a transmittance of 83%. Meanwhile, the opaque metal layer 281 ordinarily has a low transmittance because of its light shielding characteristics. Embodiments make the opaque metal layer 281 thinner to provide a transmittance of 73% to the opaque metal layer 281. When the opaque metal layer 281 of 50 Å thickness is formed of a molybdenum-titanium alloy, for example, the combined transmittance of the opaque metal layer 281 and the transparent conductive metal layer 280 becomes 70%. In thickness of the transparent conductive layer 280 may be 500 Å.

Preferably, the combined transmittance of the opaque metal layer 281 and the transparent conductive metal layer 280 is 50% or higher. The combined transmittance lower than 50% results in a decreased brightness of the pixel and may produce a noticeably narrower viewing angle.

Figure 6:
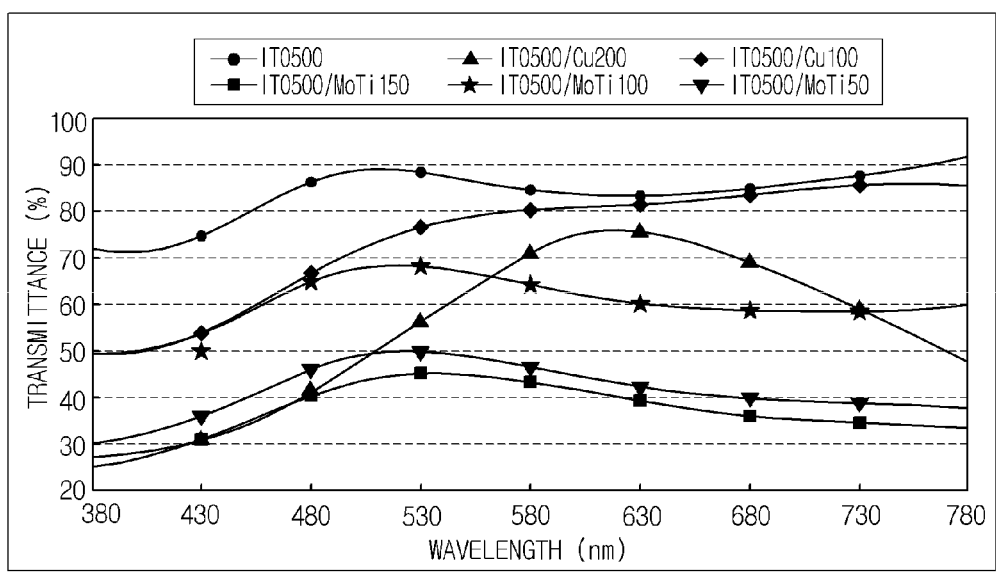
FIG. 6 is a data sheet illustrating transmittance characteristics for single layers of a transparent conductive material or an opaque metal and for double layers thereof.

FIG. 6 is a graph illustrating transmittance characteristics of a single-layered ITO(500 Å) film, a double-layered ITO (500)/Cu(200 Å) film, a double-layered ITO(500 Å)/Cu(100 Å) film, a double-layered ITO(500 Å)/MoTi(150 Å) film, a double-layered ITO(500 Å)/MoTi(100 Å) film and a double-layered ITO(500 Å)/MoTi(20 Å) film with respect to various light wavelengths. As seen from FIG. 6, if the transparent conductive material layer 280 and the opaque metal layer 281 are stacked, design specifications suitable to provide a transmittance of 70% can be determined. The design specifications include the thicknesses of the transparent conductive material layer and the opaque metal layer, and the light wavelength used for the exposure process. As such, when the electrode formation process is performed according to the determined design specifications, the electrodes with a fine line-width of 3.5 µm or less can be formed while preventing defects such as a chuck stain.

More specifically, when a stacked layer structure of the transparent conductive material layer 280 and the opaque metal layer 281 has a transmittance of 70% and a reflection ratio of 50%, transmittance deterioration due to the use of the opaque metal layer 281 can be prevented without generating the chuck stain. In other words, if the stacked layer structure has a transmittance of more than 70%, the possibility of generating the chuck stain increases accordingly. Therefore, the stacked layer structure preferably has a transmittance of 70% or less.

Thereafter, the etch process is performed for the opaque metal layer 281 and the transparent conductive material layer 280 using the photo resist patterns, which each have the line-width W2 of 3.5 µm or less and are spaced from one another by a fixed distance L2 of 14.3 µm or more, as an etch mask, in order to form the pixel electrodes.

As seen from FIGS. 7A and 7B, an etch critical dimension (CD) bias between the photo resist pattern PR and the electrode pattern EP being etched by an etchant increases with the etch time. "AL" shown in the drawings indicates an array layer. FIG. 7A shows electrode pattern EP etched for 0.3 µm whereas FIG. 7B shows electrode pattern EP etched for 1 µm. The difference in the etching distance is due to the increase of the etch time. As such, the line-widths of actually formed electrodes can become narrower due to the etch critical dimension when the etch process using the photo resist pattern of 3.5 µm or less is performed.

If the opaque metal layer is formed from a MoTi alloy, the transmittance of the opaque metal layer decreases with the lapse of deposition time whereas the reflection ratio of the opaque metal layer increases with the lapse of deposition time. Given such characteristics of the opaque metal layer and that the transparent conductive material layer has a transmittance of 83% or more, the stacked layer structure exhibits a transmittance characteristic of 70% when an opaque metal layer is configured to have a transmittance of 50% or more and a reflection ratio of 25% or less. Such transmittance characteristic of 70% prevents the chuck stain.

In this manner, the present embodiment allows the electrode formed in a stacked layer structure of the transparent conductive material layer and the opaque metal layer to have a transmittance of 70% or less and a reflection ratio of 50% or less, obtaining a desirable transmittance that prevents the chuck stain.

The LCD device and the fabricating method thereof according to embodiment of the present disclosure allow the electrodes to be formed to have a double layered structure with the transparent conductive material layer and the opaque metal layer. Therefore, the transmittance of the pixel region can be enhanced while preventing the chuck stain during an exposing process for fabricating the LCD device. Moreover, the LCD device and the fabricating method thereof according to embodiment can provide the pixel electrodes each having a fine line-width.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A liquid crystal display device comprising:
a substrate;
a gate line and a data line intersecting with the gate line on the substrate, the gate line and the data line defining a pixel region;
a switching element at an intersection point of the gate line and the data line;
one or more pixel electrodes parallel to the data line, the one or more pixel electrodes formed by stacking a transparent conductive material layer and an opaque metal layer; and
one or more common electrodes within the pixel region to alternate with the one or more pixel electrodes, the one or more common electrodes parallel to the data line and formed by stacking the transparent conductive material layer and the opaque metal layer;
wherein the stacked transparent conductive material layer and the opaque metal layer are configured to set light transmittance of zones corresponding to the pixel electrodes and the common electrodes at or below a value to prevent forming of a defect in the liquid crystal display device during a photolithography process for fabricating the liquid crystal display device,
wherein each of the pixel electrodes includes a first pixel electrode and a second pixel electrode disposed at the pixel region,
wherein the first pixel electrode is parallel to the gate line and the first and the second pixel electrodes have a stacked layer structure formed by the transparent conductive material layer and the opaque metal layer, and
wherein the first pixel electrode and the second pixel electrode are formed by a single body and a portion of the first pixel electrode is overlapped with a drain electrode and a channel layer of the switching element.

2. The liquid crystal display device of claim 1, wherein each of the transparent conductive material layer and the opaque metal layer forming the pixel electrodes and the common electrodes have a line-width of 3.5 μm or less.

3. The liquid crystal display device of claim 1, wherein the transparent conductive material layer comprises a material selected from the group consisting of indium-tin-oxide (ITO), indium-tin-zinc-oxide (ITZO) and indium-zinc-oxide (IZO).

4. The liquid crystal display device of claim 1, wherein the opaque metal layer is a material selected from the group consisting of molybdenum (Mo), titanium (Ti), tantalum (Ta), tungsten (W), copper (Cu), chrome (Cr), aluminum (Al) and alloys thereof.

5. The liquid crystal display device of claim 1, wherein a distance between a pixel electrode and an adjacent common electrode is 14.3 μm or more.

6. The liquid crystal display device of claim 1, wherein the value is 50% to 70%.

7. The liquid crystal display device of claim 1, wherein the defect comprises chuck stain.

8. A method of fabricating a liquid crystal display device, the method comprising:
forming a metal film on a substrate;
forming a gate electrode, a gate line and a first common line using a first masking procedure;
forming a gate insulation film on the substrate formed with the gate electrode;
forming a channel layer, a source electrode, a drain electrode and a data line on the substrate using a second masking procedure;
forming a protective film on the substrate provided formed with the source and drain electrodes;
forming a contact hole in the protective film using to a third masking procedure to expose a part of the drain electrode;
forming a transparent conductive material layer and an opaque metal layer on the substrate formed with the protective film; and
performing an etch process according to a fourth masking procedure on the opaque metal layer and the transparent conductive material layer to form pixel electrodes and common electrodes having a stacked layer structure,
wherein the stacked layer structure are configured to set light transmittance of zones corresponding to the pixel electrodes and the common electrodes at or below a value to prevent forming of a defect in the liquid crystal display device during a photolithography process,
wherein each of the pixel electrodes includes a first pixel electrode and a second pixel electrode disposed at a pixel region,
wherein the first pixel electrode is parallel to the gate line and the first and the second pixel electrodes have the stacked layer structure formed by the transparent conductive material layer and the opaque metal layer, and
wherein the first pixel electrode and the second pixel electrode are formed by a single body and a portion of the first pixel electrode is overlapped with the portion of the drain electrode and the channel layer.

9. The method of claim 8, wherein each of the transparent conductive material layer and the opaque metal layer have a line-width of 3.5 μm or less.

10. The method of claim 8, wherein:
the pixel electrodes and the common electrodes are arranged to alternate with each other, and
a distance between a pixel electrode and an adjacent common electrode is 14.3 μm or more.

11. The method of claim 8, wherein the transparent conductive material layer is formed of a material selected from the group consisting of indium-tin-oxide (ITO), indium-tin-zinc-oxide (ITZO) and indium-zinc-oxide (IZO).

12. The method of claim 8, wherein the opaque metal layer is formed of a material selected from the group consisting of molybdenum (Mo), titanium (Ti), tantalum (Ta), tungsten (W), copper (Cu), chrome (Cr), aluminum (Al) and alloys thereof.

13. The method of claim 8, wherein the value is 50% to 70%.

14. The method of claim 8, wherein the defect comprises chuck stain.

* * * * *